(12) United States Patent
Chen

(10) Patent No.: US 9,225,090 B2
(45) Date of Patent: Dec. 29, 2015

(54) FLEXIBLE FLAT CABLE CONNECTOR FIXING STRUCTURE

(71) Applicant: BING XU PRECISION CO., LTD., New Taipei (TW)

(72) Inventor: Chih-jung Chen, New Taipei (TW)

(73) Assignee: BING XU PRECISION CO., LTD., New Taipei (TW)

( * ) Notice: Subject to any disclaimer, the term of this patent is extended or adjusted under 35 U.S.C. 154(b) by 131 days.

(21) Appl. No.: 14/026,644

(22) Filed: Sep. 13, 2013

(65) Prior Publication Data

US 2014/0113484 A1    Apr. 24, 2014

(30) Foreign Application Priority Data

Oct. 22, 2012  (TW) .............................. 101220358 U

(51) Int. Cl.
| | |
|---|---|
| *H01R 12/79* | (2011.01) |
| *H05K 3/36* | (2006.01) |
| *H01R 13/58* | (2006.01) |
| *H01R 13/633* | (2006.01) |
| *H01R 13/66* | (2006.01) |

(52) U.S. Cl.
CPC ............ *H01R 12/79* (2013.01); *H01R 13/5812* (2013.01); *H05K 3/361* (2013.01); *H01R 13/6335* (2013.01); *H01R 13/6658* (2013.01); *H05K 2201/10189* (2013.01)

(58) Field of Classification Search
CPC ................................ H05K 3/365; H01R 12/79
USPC ..................................... 439/76.1, 67, 77, 493
See application file for complete search history.

(56) References Cited

U.S. PATENT DOCUMENTS

| | | | | |
|---|---|---|---|---|
| 3,573,704 | A * | 4/1971 | Tarver .......................... | 439/76.1 |
| 4,072,377 | A * | 2/1978 | Van de Loo et al. .......... | 439/76.1 |
| 4,871,319 | A * | 10/1989 | Babow ................... | H01R 12/62 |
| | | | | 439/493 |
| 4,948,379 | A * | 8/1990 | Evans ........................... | 439/329 |
| 5,955,703 | A * | 9/1999 | Daly et al. ................. | 174/117 R |
| 6,083,039 | A * | 7/2000 | Finona .......................... | 439/493 |
| 6,695,641 | B1 * | 2/2004 | Lee ............................... | 439/493 |
| 6,746,255 | B1 * | 6/2004 | Lee et al. ...................... | 439/108 |
| 7,086,888 | B2 * | 8/2006 | Wu ................................ | 439/358 |
| 7,140,909 | B2 * | 11/2006 | Moritake ............... | H01R 12/89 |
| | | | | 439/260 |
| 7,467,969 | B2 * | 12/2008 | Liu et al. ....................... | 439/493 |
| 7,484,994 | B2 * | 2/2009 | Ko .................................. | 439/495 |
| 7,497,709 | B1 * | 3/2009 | Zhang ................ | H01R 12/7094 |
| | | | | 200/51.09 |
| 7,553,191 | B2 * | 6/2009 | Su et al. ......................... | 439/637 |
| 7,563,108 | B1 * | 7/2009 | Wu ............................... | 439/76.1 |
| 7,682,162 | B2 * | 3/2010 | Yuan ............................ | 439/76.1 |
| 7,704,089 | B2 * | 4/2010 | Tseng ..................... | H01R 13/46 |
| | | | | 439/247 |
| 7,803,009 | B2 * | 9/2010 | Su et al. ........................ | 439/492 |

(Continued)

*Primary Examiner* — Neil Abrams

(74) *Attorney, Agent, or Firm* — Hauptman & Ham, LLP

(57) ABSTRACT

The present invention discloses a flexible flat cable connector fixing structure. The fixing structure includes a flexible flat cable, a first connector, and a hold-down strip. The first connector includes a plurality of contacts, a first slot and a first circuit board. The first slot includes a plurality of passageways, for placing the contacts, and a back-end seam. The first circuit board is fixed with a back of the first slot and includes a plurality of conducting portions, for being conductively fixed with the contacts, and a plurality of conducting parts, positioned on a front of the first circuit board, for being electrically connected to the flexible flat cable. The flexible flat cable is conductively fixed with the conducting parts, stretches through the seam, and further stretches through the hold-down strip to be positioned by the hold-down strip.

12 Claims, 20 Drawing Sheets

(56) References Cited

U.S. PATENT DOCUMENTS

| | | | |
|---|---|---|---|
| 7,815,459 B2* | 10/2010 | Chen | H01R 9/03 439/351 |
| 7,896,688 B2* | 3/2011 | Sukegawa et al. | 439/494 |
| 8,052,430 B2* | 11/2011 | Wu | H01R 9/032 439/76.1 |
| 8,182,284 B2* | 5/2012 | Kuo | 439/545 |
| 8,430,692 B2* | 4/2013 | Peng et al. | 439/607.46 |
| 8,512,071 B2* | 8/2013 | Tseng et al. | 439/493 |
| 8,672,689 B2* | 3/2014 | Tseng | 439/76.1 |
| 8,696,380 B2* | 4/2014 | Su et al. | 439/606 |
| 8,740,631 B2* | 6/2014 | Chen | 439/76.1 |
| 8,758,030 B2* | 6/2014 | Chen | 439/76.1 |
| 8,845,341 B2* | 9/2014 | Chen et al. | 439/76.1 |
| 9,033,744 B2* | 5/2015 | Chen | 439/660 |
| 2014/0113484 A1* | 4/2014 | Chen | 439/492 |
| 2015/0024633 A1* | 1/2015 | Chen | 439/626 |

\* cited by examiner

FLEXIBLE FLAT CABLE CONNECTOR FIXING STRUCTURE

BACKGROUND OF THE INVENTION

1. Field of the Invention

The invention relates to a flexible flat cable connector fixing structure, and more particularly, to a flexible flat cable connector fixing structure which can raise the pulling force between the flexible flat cable and the connector to raise the usage stability.

2. Description of the Prior Art

A flexible flat cable (FFC) is widely used in the electronic devices because it can be bended. Furthermore, a connector is often set on an end of the FFC to be plugged into the electronic device such that the FFC can be electrically connected to the electronic device. Please refer to FIG. 9A and FIG. 9B, these figures depict an FFC connector according to the related art. The FFC connector comprises a FFC 100, a first connector 200, and a second connector 300. The FFC 100 is composed of a plurality of conductive cables, and comprises a first cable end 101 and a second cable end 102. The first connector 200 comprises a first slot 210, a plurality of contacts 220, a first circuit board 230, and a back cover 240. The first slot 210 comprises a plurality of passageways 211 and a top plate 212 positioned at the top of the slot 210. A pulling part 250 is fixedly hitched on the top plate 212. The contacts 220 are plugged into the passageways 211. The contacts 220 comprise first conductive legs 221 on one ends and second conductive legs 222 on the other ends. The first circuit board 230 comprise a plurality of conducting portions 231 for conductively fixed (ex: soldered) with the second conductive legs 222 of the contacts 220. The back cover 240 covers the back of the first slot 210. The back cover 240 comprises a top trench 241 on the above of the back cover 240 and a lower trench 242 on the lower of the back cover 240. The second connector 300 is positioned on the second circuit board 310, and comprises a second slot 320 and a plurality of contacts 321. When they are assembled, the first cable end 101 of the FFC 100 is conductively fixed on the front end of the first circuit board 230 and stretches out via the top trench 241 of the back cover 240. The second cable end 102 is electrically connected to the contacts 321 of the second connector 300.

The above-mentioned connector has its disadvantages. For example, the FFC 100 can directly stretch out via the top trench 241 of the back cover 240. However, the FFC 100 is not supported by any components. If the FFC 100 is pulled by a pulling force, the connection portions of the FFC 100 are easily damaged or pulled apart such that the electrical connection or transmission may be ruined. Therefore, how to improve the current design is a new question in this industry.

Therefore, the applicants consider the above-mentioned disadvantages of the current design, and want to develop a FFC connector fixing structure having better fixing and supporting characteristics which can raise the capability of resisting pulling force. In the following disclosure, the present invention will be introduced.

SUMMARY OF THE INVENTION

It is therefore one of the primary objectives of the claimed invention to provide a flexible flat cable connector fixing structure, which can raise the connecting force and supporting force of FFC, and also raise the mutual pulling force of the connector and the FFC.

Furthermore, another objective of the claimed invention is to provide a flexible flat cable connector fixing structure, which can prevent the connection portion of the FFC from being damaged or pulled apart. This raises the stability of electrical connection and smoothes the signal transmission such that quality of the electrical connection and the signal transmission can be ensured.

According to an exemplary embodiment of the claimed invention, a flexible flat cable connector fixing structure is disclosed. The flexible flat cable connector fixing structure comprises: a flexible flat cable, a first connector, and a hold-down strip. The first connector is connected to an end of the flexible flat cable, and the first connector comprises a plurality of contacts, a first slot, and a first circuit board. The first slot comprises a plurality of passageways, for placing the contacts, and a back-end seam. The first circuit board is fixed with a back of the first slot, and the first circuit board comprises: a plurality of conducting portions, for being conductively fixed with the contacts, and a plurality of conducting parts, positioned on a front of the first circuit board, for being electrically connected to the flexible flat cable. The hold-down strip is fixed on the first circuit board. The flexible flat cable is conductively fixed with the conducting parts, stretches through the seam, and further stretches through the hold-down strip to be positioned by the hold-down strip.

According to an exemplary embodiment of the claimed invention, a flexible flat cable connector fixing structure is disclosed. The flexible flat cable connector fixing structure comprises: a flexible flat cable, a first connector, and a back cover. The first connector is connected to an end of the flexible flat cable, and the first connector comprises a plurality of contacts, a first slot, and a first circuit board. The first slot comprises a plurality of passageways, for placing the contacts. The first circuit board is fixed with a back of the first slot, and the first circuit board comprises: a plurality of conducting portions, for being conductively fixed with the contacts, and a plurality of conducting parts, positioned on a front of the first circuit board, for being electrically connected to the flexible flat cable. The back cover is fixed on the first slot, and the back cover comprises at least one trench hole, for allowing the flexible flat cable to stretch through such that the flexible flat cable is held down and supported by the back cover to raise a pulling force between the flexible flat cable and the first connector.

According to an exemplary embodiment of the claimed invention, a flexible flat cable connector fixing structure is disclosed. The flexible flat cable connector fixing structure comprises a flexible flat cable, a first connector, and a back cover. The first connector is connected to an end of the flexible flat cable, and the first connector comprises: a plurality of contacts, a first slot, and a first circuit board. The first slot comprises a plurality of passageways, for placing the contacts. The first circuit board is fixed with a back of the first slot, and the first circuit board comprises: a plurality of conducting portions, for being conductively fixed with the contacts, and a plurality of conducting parts, positioned on a front of the first circuit board, for being electrically connected to the flexible flat cable. The back cover is fixed on the first slot, for holding down and supporting flexible flat cable to raise a pulling force between the flexible flat cable and the first connector.

These and other objectives of the claimed invention will no doubt become obvious to those of ordinary skill in the art after reading the following detailed description of the preferred embodiment that is illustrated in the various figures and drawings.

DETAILED DESCRIPTION OF THE PREFERRED EMBODIMENT

Figure 1:
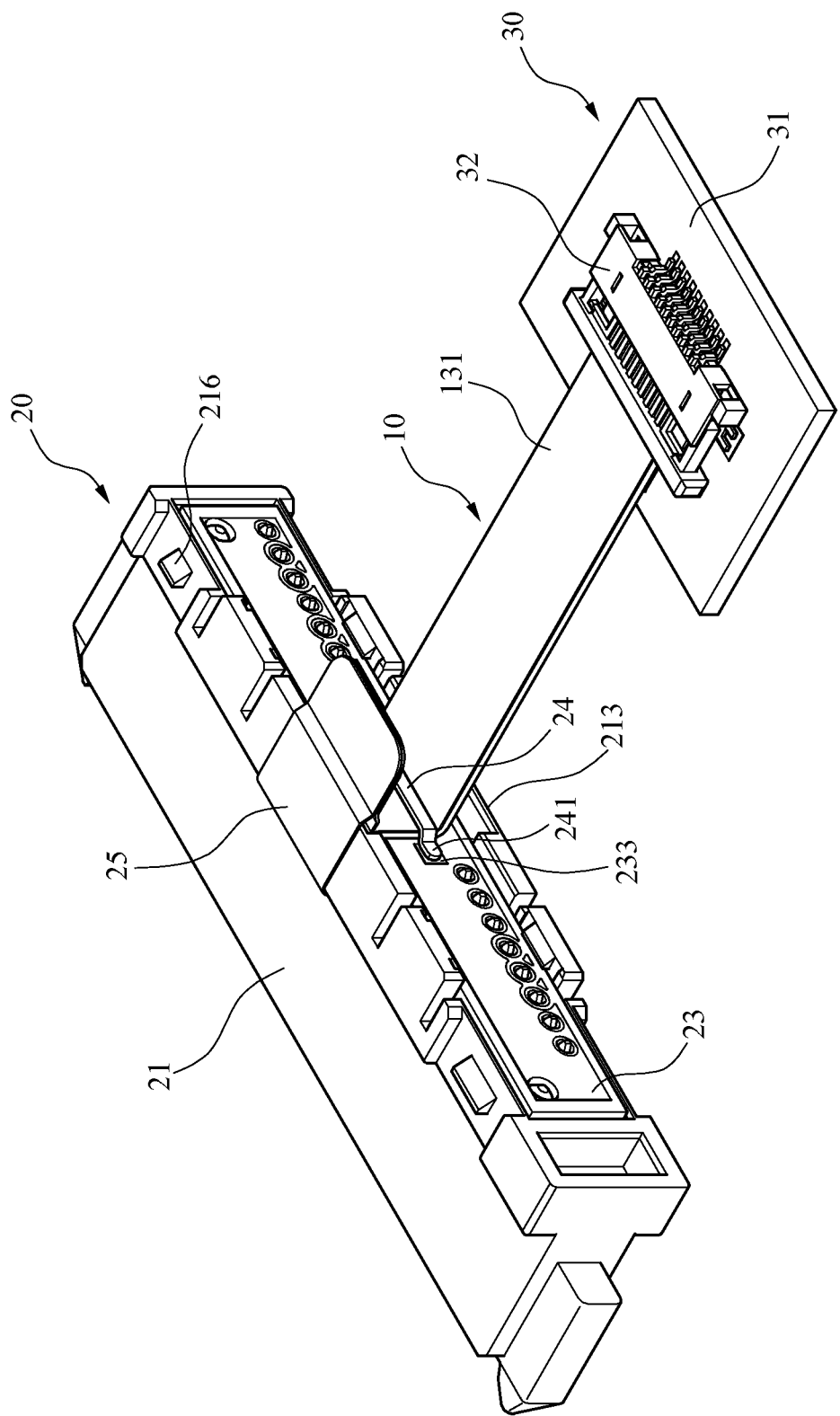
FIG. 1 is a diagram depicting an FFC connector fixing structure according to a first embodiment of the present invention.
Figure 1A:
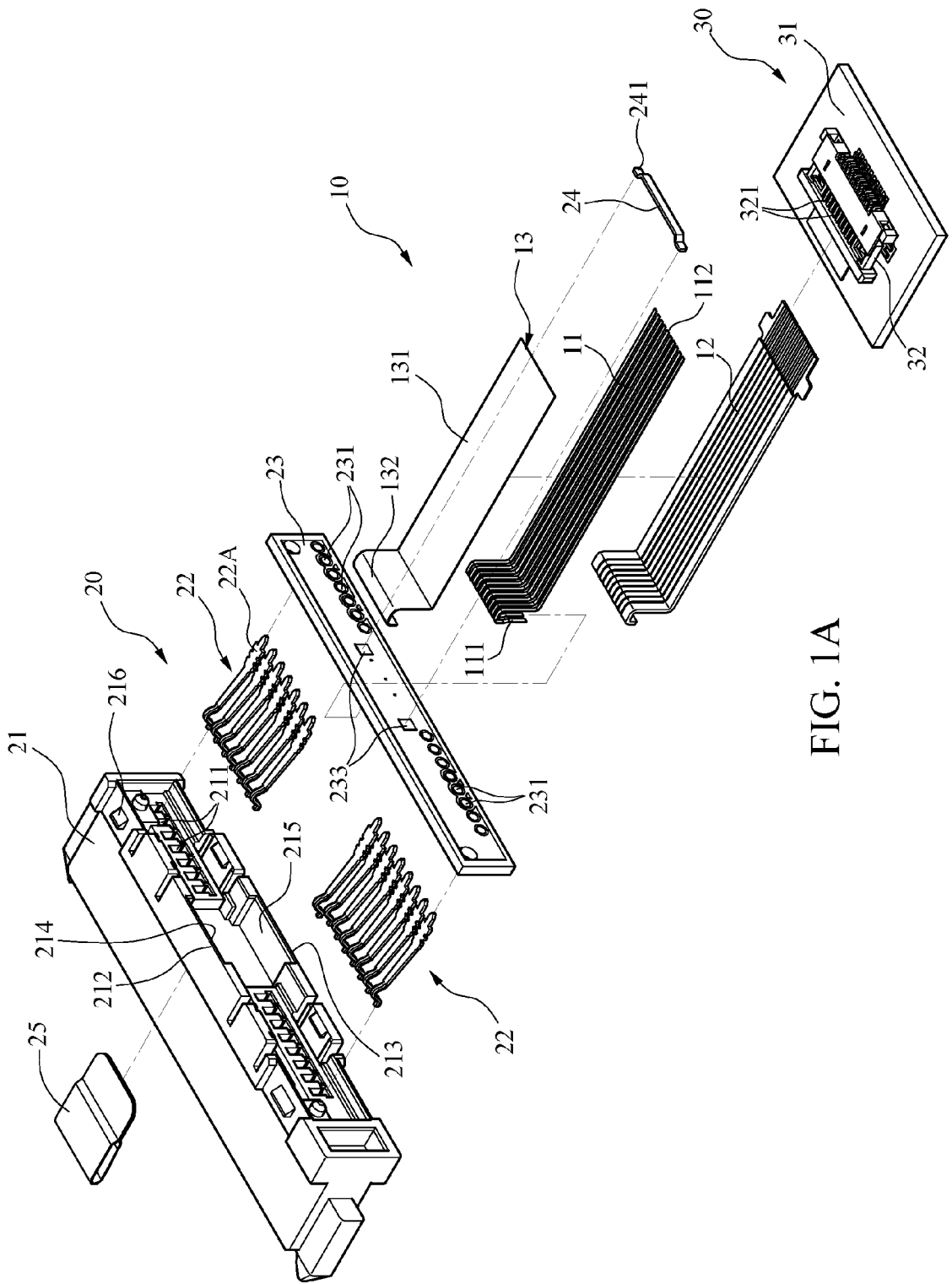
FIG. 1A is an explosion diagram depicting the FFC connector fixing structure according to a first embodiment of the present invention.
Figure 1B:
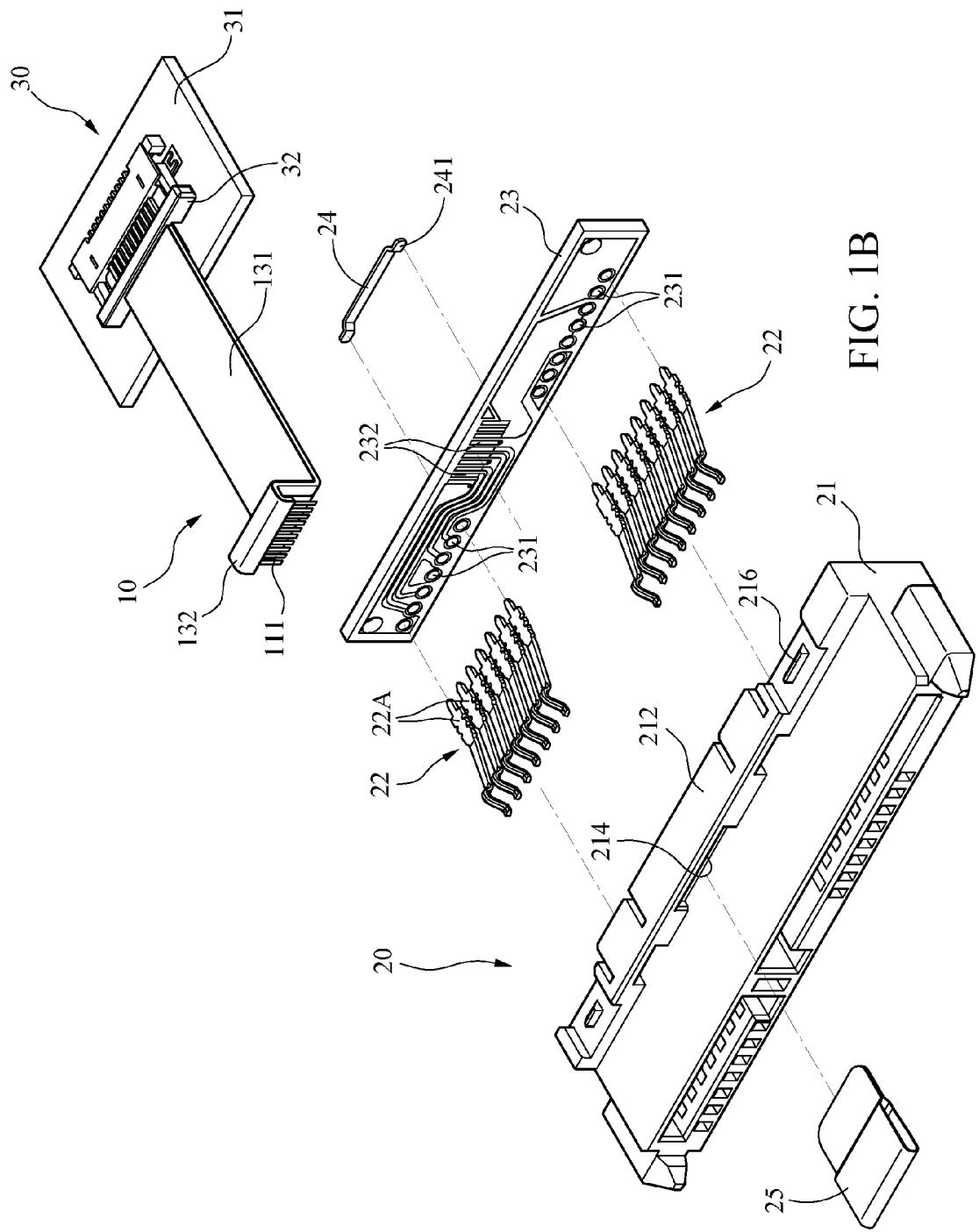
FIG. 1B is another explosion diagram depicting the FFC connector fixing structure according to a first embodiment of the present invention.

Please refer to FIG. 1, FIG. 1A, and FIG. 1B, which depict a flexible flat cable connector fixing structure according to a first embodiment of the present invention. The flexible flat cable connector comprises a flexible flat cable (FFC) 10, a first connecting portion 20, and a second connecting portion 30. The FFC 10 comprises a plurality of conductive cables 11, a lower insulating layer 12, and an upper insulating layer 13. The FFC 11 comprises a first cable end having a front end and a back end (according to the figures) and a second cable end having a front end and a back end. The first cable end 111 is a bended end.

The upper insulating layer 12 and the lower insulating layer 13 cover the cables 11. The front ends of the upper insulating layer 12 and the lower insulating layer 13 are also bended as shown as the bended portion 132. In addition, an aluminum foil layer 131 can be positioned on the upper insulating layer 13, and is used to connect to ground.

The first connecting portion 20 is a connector. The connector 20 comprises a first slot 21, a plurality of contacts 22, a first circuit board 23. The first slot 21 comprises a plurality of passageways 211, a top plate 212 positioned on the top of the first slot 21, and a bottom plate 213 positioned on the bottom of the first slot 21. A top-plate seam 214 is formed on a position lower the center of the top plate 212, and is used for hitching a pulling portion 25. A bottom-plate seam 215 is formed on a position above the center of the bottom plate 213. The top-plate seam 214 and the bottom-plate seam 215 can be regarded as a back-end seam of the first slot 21. Besides, fixing blocks 216 are positioned on two sides of the first slot 21.

The contacts 22 are plugged into the passageways 211. Each of the contacts 22 comprises a conductive leg 22A. The first circuit board 23 is fixed with the back of the first slot 21. The first circuit board 23 comprises a plurality of conductive portions 231 for being conductively fixed (such as soldered) with the conductive legs 22A of the contacts 22. In addition, a plurality of conductive parts 232 are formed on the center of the front face of the first circuit board 23 (as shown in FIG. 1B), and a fixing portion 233 (such as a fixing trench) is positioned on the two sides of the center of the first circuit board 23. Furthermore, a hold-down strip 24 is fixed with the fixing portions 233 by using its side portions 241 on the two sides of the hold-down strip 24.

The second connecting portion 30 comprises a second connector 32 and a second circuit board 31. The second connector 32 is positioned on the second circuit board 31 and comprises a plurality of contacts 321.

When they are assembled, the first cable end 111 of the flexible flat cable 10 is conductively fixed on the conductive parts 232 on the front face of the first circuit board 23. And then, the FFC 10 stretches out via the top-plate seam 214 (the upper side of the first circuit board 23) and goes down. In addition, the FFC 10 stretches out via the hold-down strip 24 and fixed by the hold-down strip 24 such that the second cable end 112 is conductively fixed with the contacts 321 of the second connector 32.

Under the above-mentioned configuration, when the FFC 10 is fixed with the first connector 20 (the first circuit board 23), the FFC 10 is fixed and supported by the hold-down strip 24 such that the pulling-force can be raised and the connection portion of the FFC can be prevented from being damaged or pulled apart. Therefore, it ensures the stability of electrical connection and smoothes the signal transmission.

Figure 2:
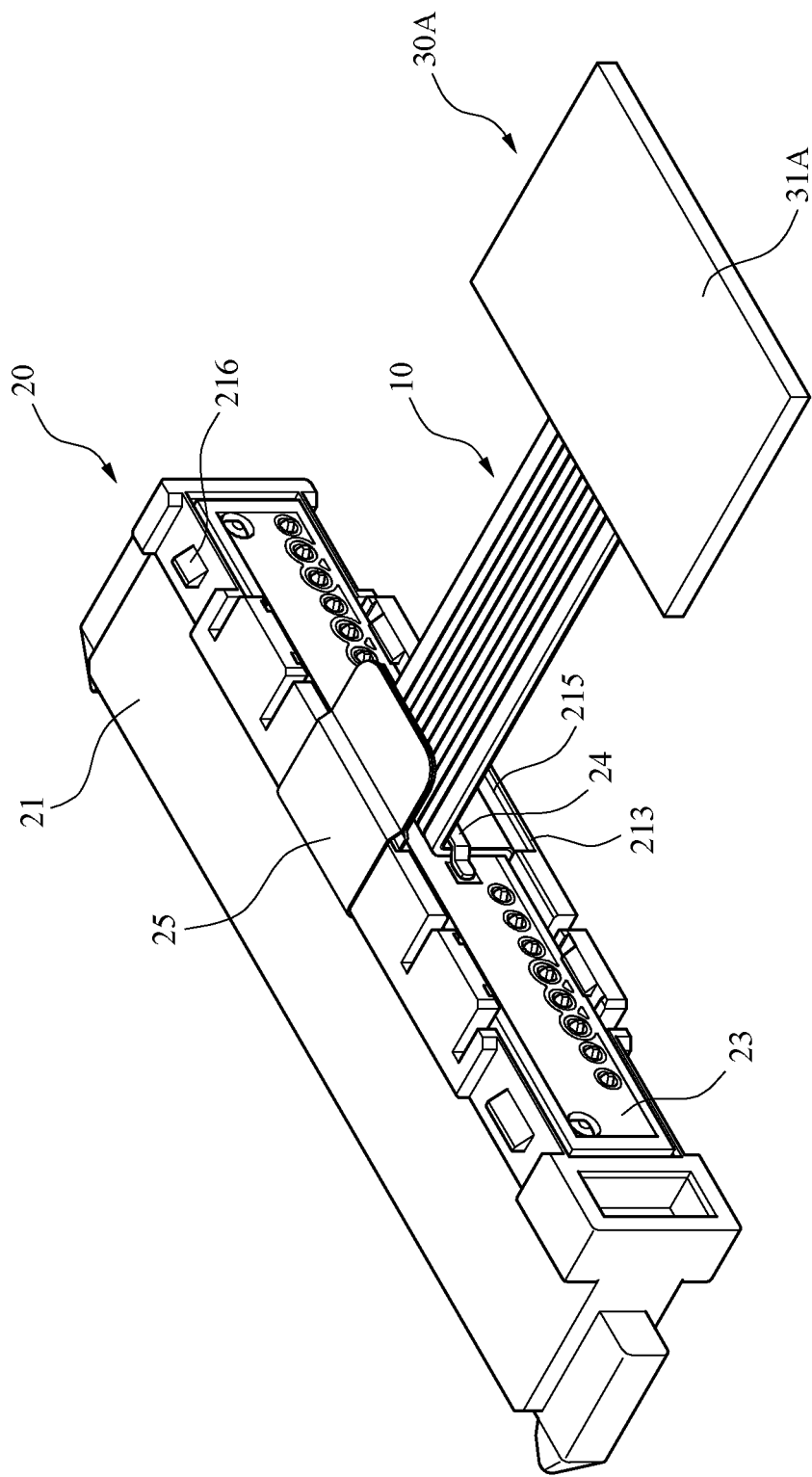
FIG. 2 is a diagram depicting an FFC connector fixing structure according to a second embodiment of the present invention.
Figure 2A:
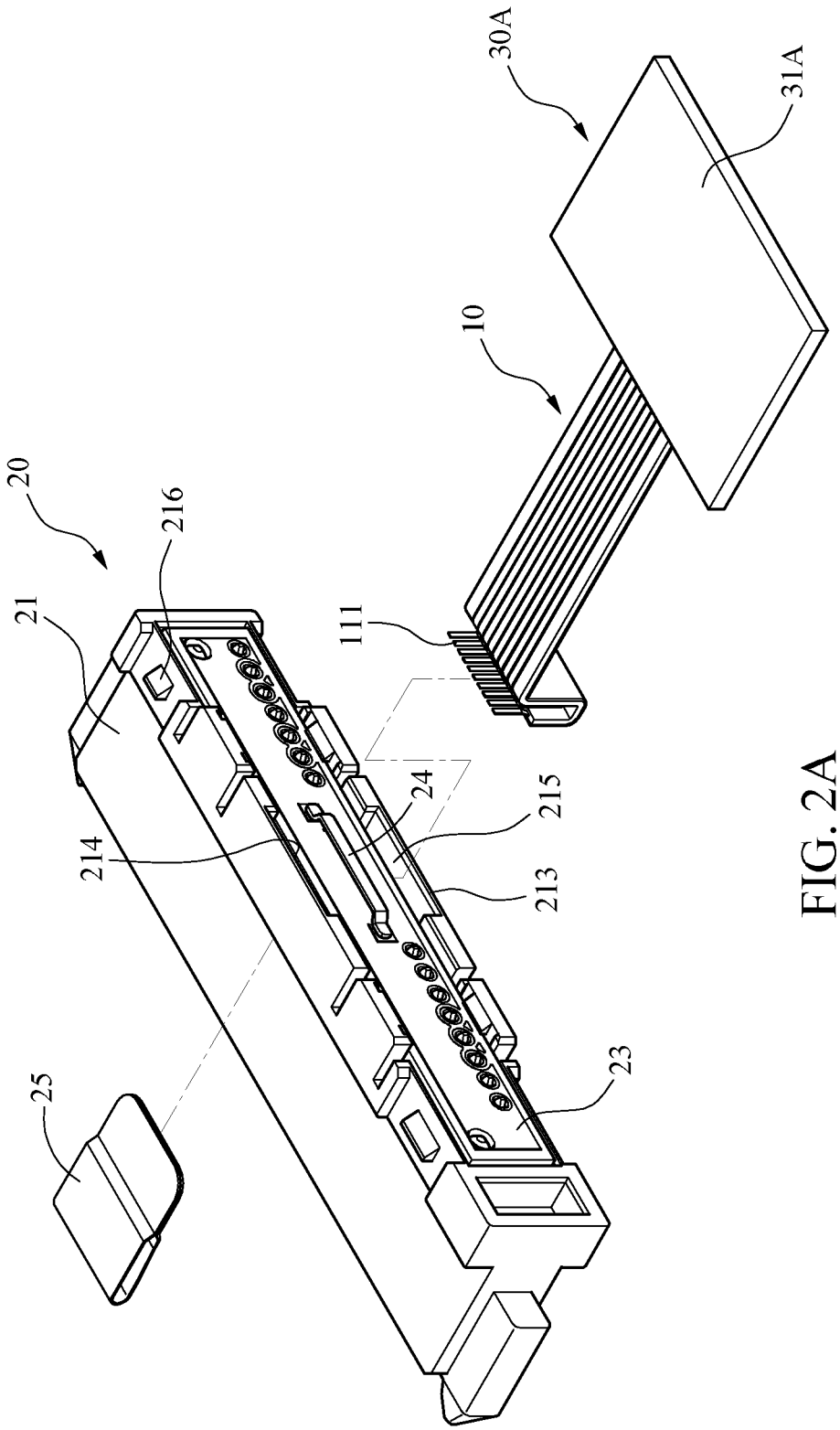
FIG. 2A is an explosion diagram depicting the FFC connector fixing structure according to a second embodiment of the present invention.

Please refer to FIG. 2 and FIG. 2A, which depict a FFC connector fixing structure according to a second embodiment of the present invention. The second embodiment is a little different from the first embodiment, and similar components have the same numbers such that further illustration can be omitted for simplicity. The difference between the first and the second embodiments is: The second connecting portion 30A only comprises a second circuit board 31A. That is, the second connecting portion 30A is merely a circuit board without the second connector 32 of the first embodiment.

When they are assembled, the first cable end 111 of the FFC 10 is conductively fixed with the first circuit board 23 and stretches out via the bottom-plate seam 215 (the bottom of the first circuit board 23) and then goes up. And then, the FFC 10 is fixed by the hold-down strip 24 and stretches out via the top of the hold-down strip 24, and then the FFC is conductively fixed with the second circuit board 31A.

Under the above-mentioned configuration, when the FFC 10 is fixed with the first connecting portion 20 (the first circuit board 23), the FFC 10 is similarly fixed and supported by the hold-down strip 24 such that the pulling-force can be raised and the connection portion of the FFC can be prevented from being damaged or pulled apart. Therefore, it ensures the stability of electrical connection and smoothes the signal transmission.

Figure 3:
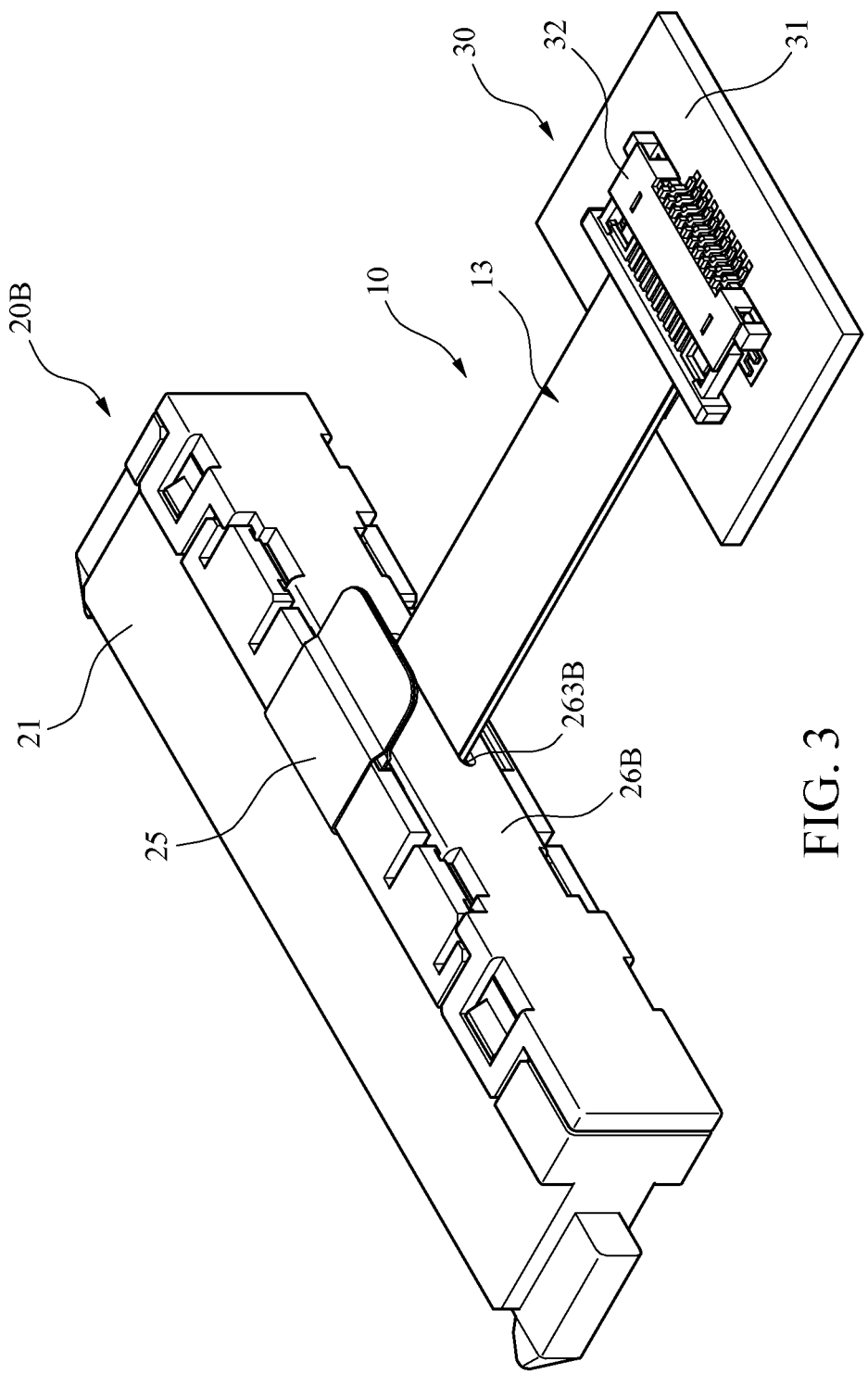
FIG. 3 is a diagram depicting an FFC connector fixing structure according to a third embodiment of the present invention.
Figure 3A:
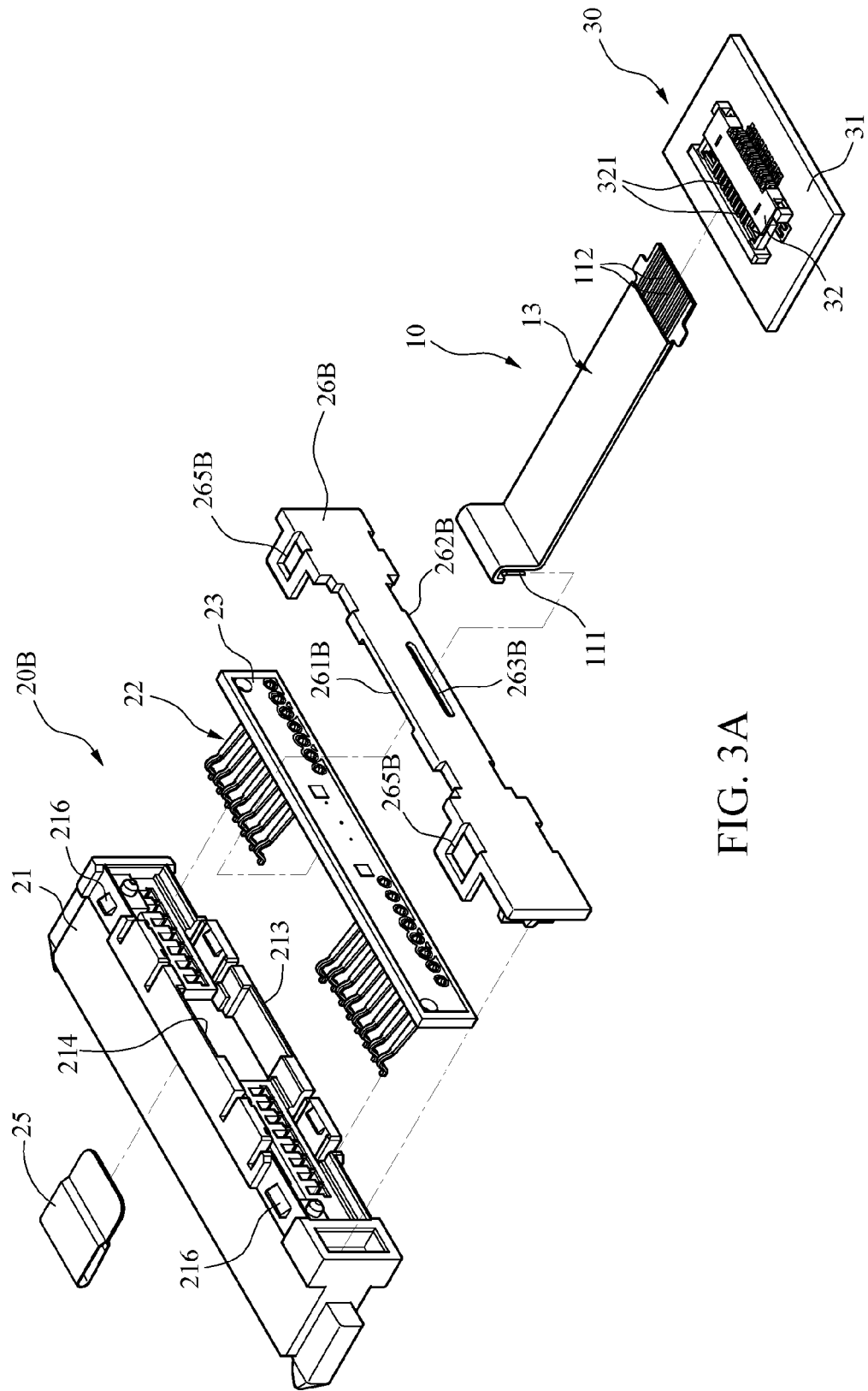
FIG. 3A is an explosion diagram depicting the FFC connector fixing structure according to a third embodiment of the present invention.

Please refer to FIG. 3 and FIG. 3A, which depict a FFC connector fixing structure according to a third embodiment of the present invention. The third embodiment is a little different from the first embodiment, and similar components have the same numbers such that further illustration can be omitted for simplicity. The difference between the first and the third embodiments is: The first connecting portion 20B further comprises a back cover 26B. A top concave trench 261B and a bottom concave trench 262B are positioned on the center of the back cover 26B. A first trench hole 263B is formed between the top concave trench 261B and the bottom concave trench 262B. Two fixing trench portions 265B are positioned on the two sides of the back cover 26B. The fixing trench portions 265B correspond to the fixing blocks 216 and are used to be fixed with the fixing blocks 216 such that the back cover 26B can be fixed with the first slot 21. Please note, this embodiment does not have the hold-down strip 24.

When they are assembled, the FFC 10 goes around the top (or the bottom) of the first circuit board 23 and goes down between the first circuit board 23 and the back cover 26B. And then, the FFC 10 stretches out via the first trench hole 263B of the back cover 26B and then conductively fixed with the second connector 32.

Under the above-mentioned configuration, when the FFC 10 is fixed with the first connecting portion 20 (the first circuit board 23), the FFC 10 is similarly fixed and supported by the back cover 26B such that the pulling-force can be raised and the connection portion of the FFC 10 can be prevented from being damaged or pulled apart. Therefore, it ensures the stability of electrical connection and smoothes the signal transmission.

Figure 4:
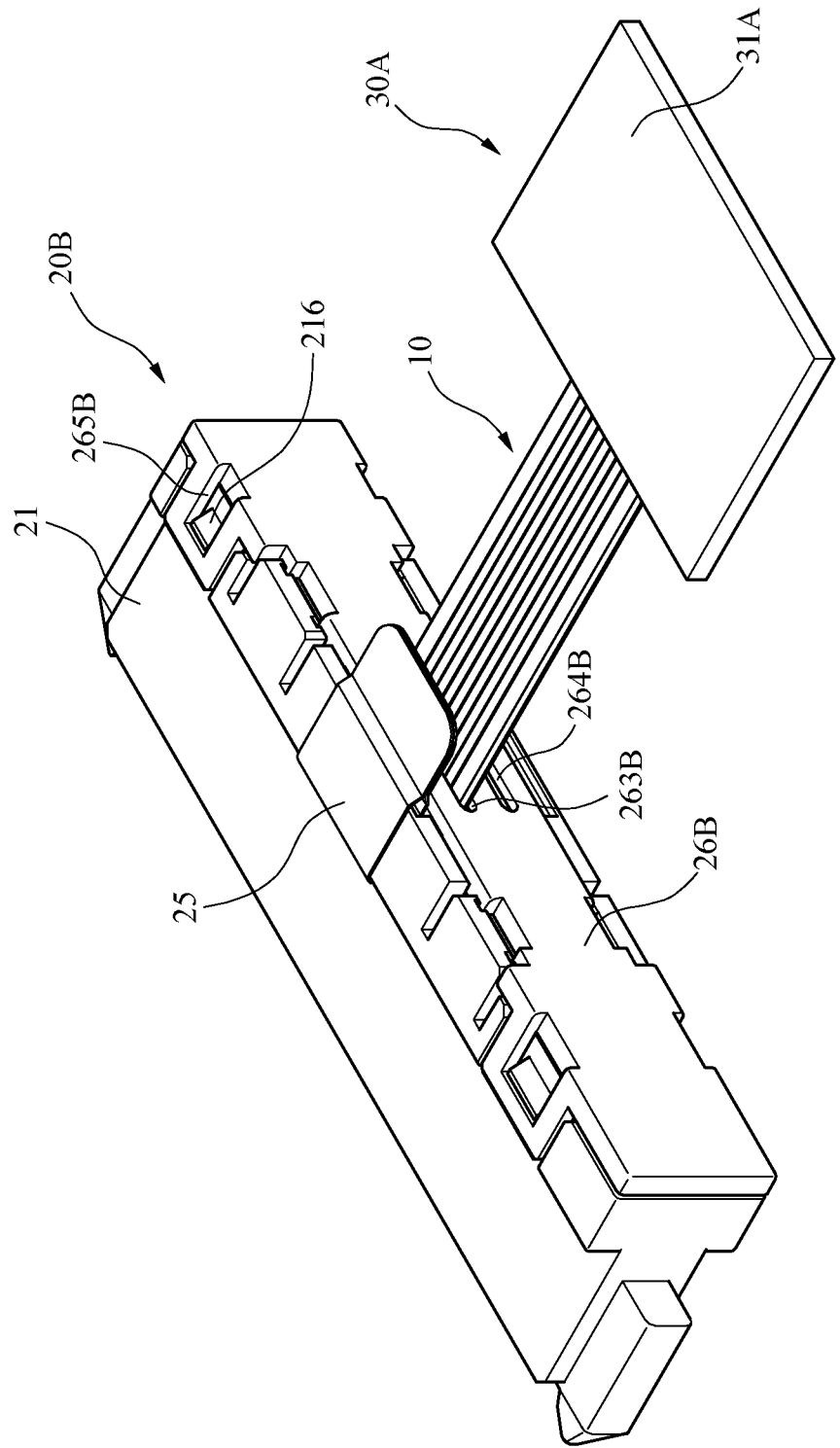
FIG. 4 is a diagram depicting an FFC connector fixing structure according to a fourth embodiment of the present invention.
Figure 4A:
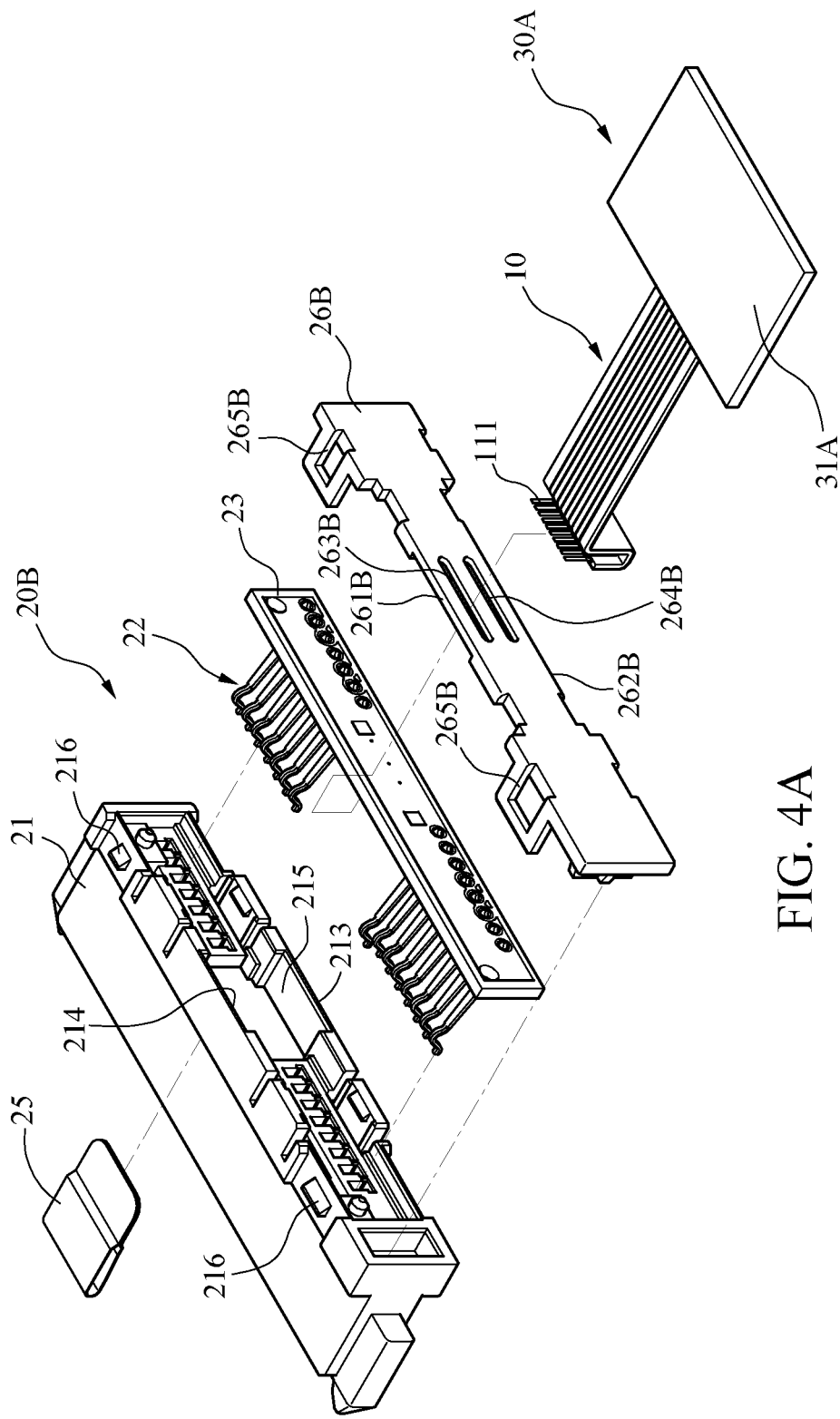
FIG. 4A is an explosion diagram depicting the FFC connector fixing structure according to a fourth embodiment of the present invention.

Please refer to FIG. 4 and FIG. 4A, which depict a FFC connector fixing structure according to a fourth embodiment of the present invention. The fourth embodiment is a little different from the third embodiment, and similar components have the same numbers such that further illustration can be omitted for simplicity. The difference between the fourth and the third embodiments is: A first trench hole 263B and a second trench hole 264B (two trench holes) are formed between the top concave trench 261B and the bottom concave trench 262B of the back cover 26B. In addition, in this embodiment, the second connecting portion 30A only comprises a second circuit board 31A. That is, the second connecting portion 30A is merely a circuit board without the connector.

When they are assembled, the FFC 10 goes around the top (or the bottom) of the first circuit board 23 and stretches out via the first trench hole 263B (or the second trench hole 264B) of the back cover 26B and then conductively fixed with the second connector 32.

Figure 5:
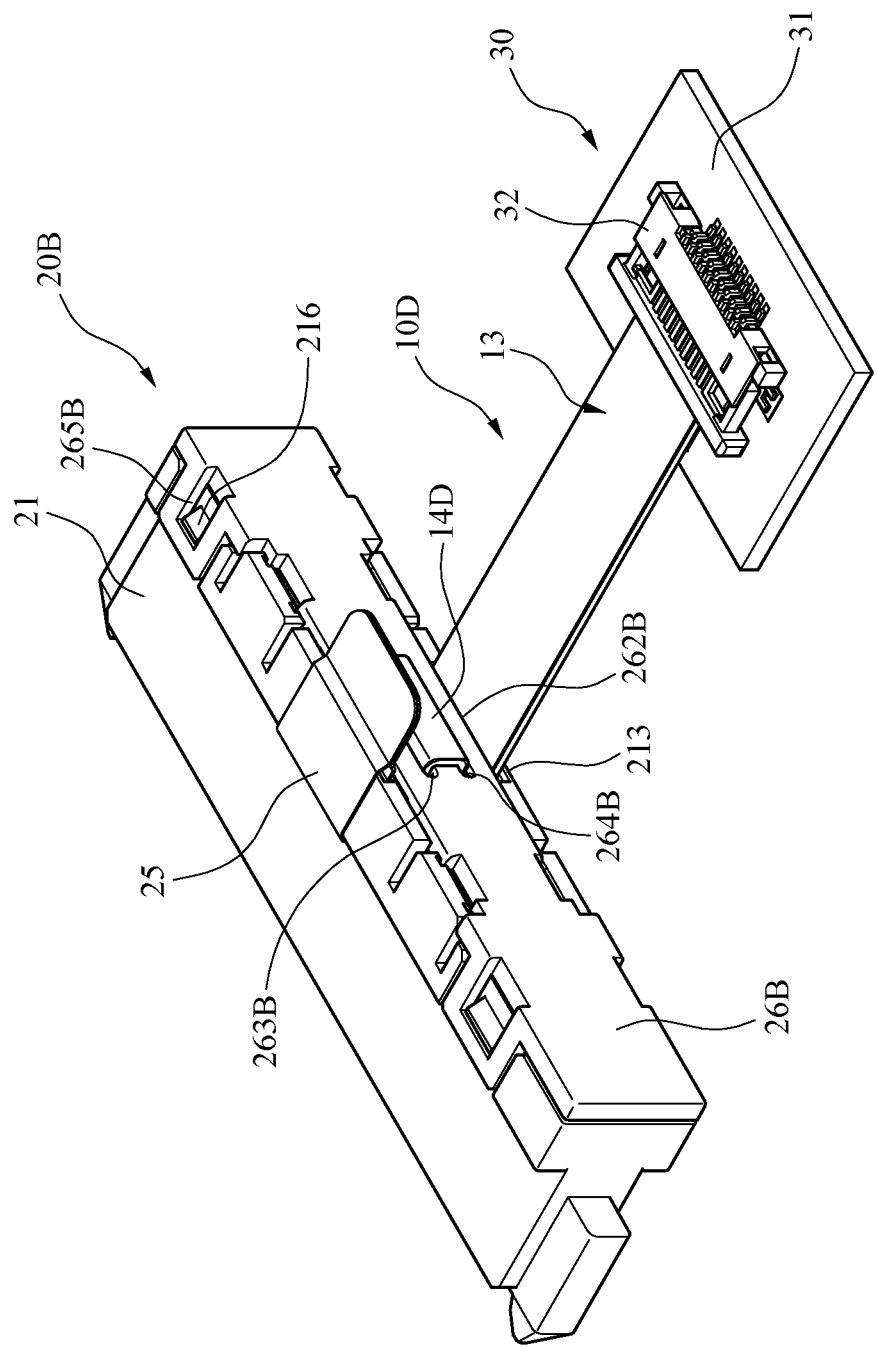
FIG. 5 is a diagram depicting an FFC connector fixing structure according to a fifth embodiment of the present invention.
Figure 5A:
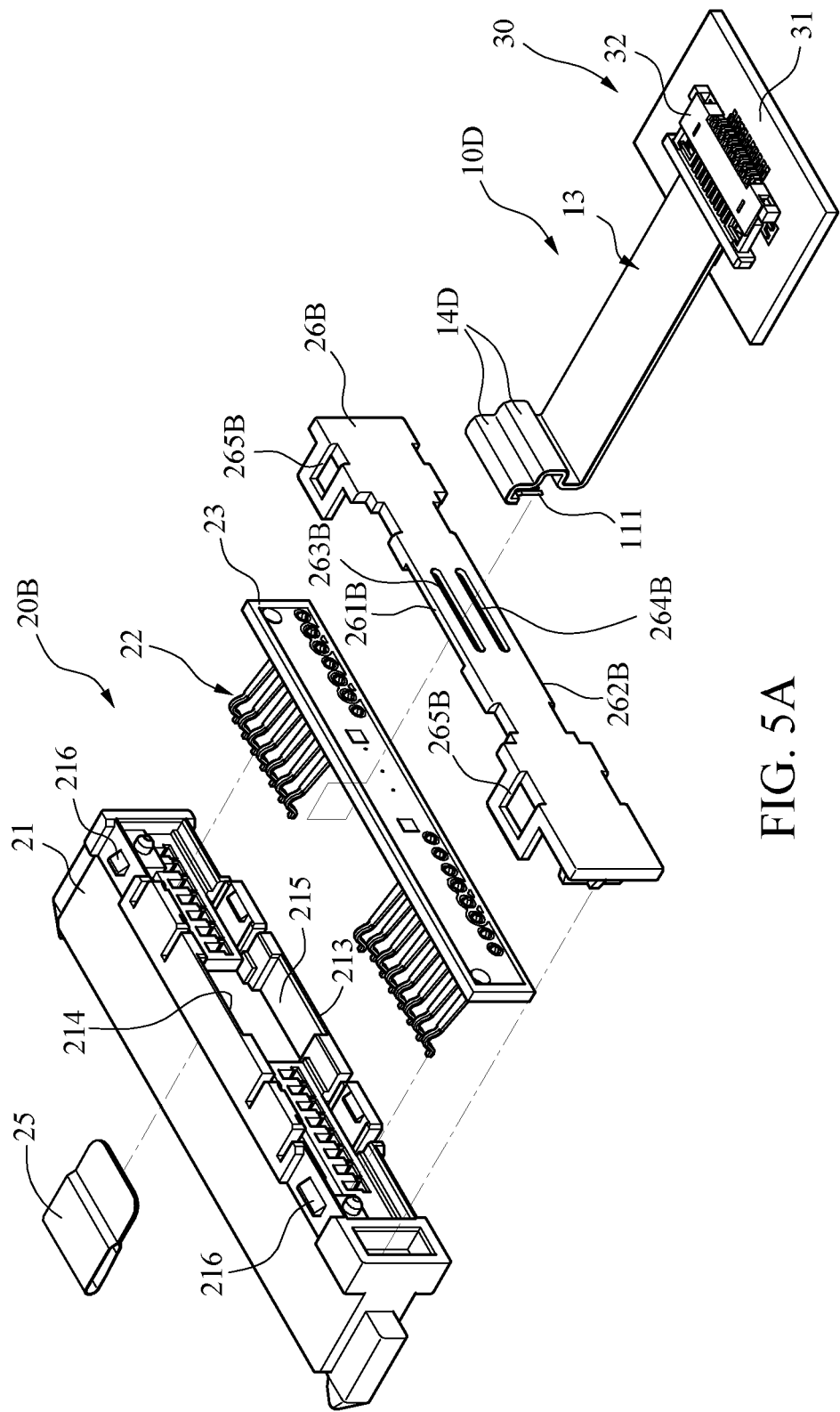
FIG. 5A is an explosion diagram depicting the FFC connector fixing structure according to a fifth embodiment of the present invention.

Please refer to FIG. 5 and FIG. 5A, which depict a FFC connector fixing structure according to a fifth embodiment of the present invention. The fifth embodiment is a little different from the third embodiment, and similar components have the same numbers such that further illustration can be omitted for simplicity. The difference between the fifth and the third embodiments is: A folded portion 14D is positioned on the front end of the FFC 10D, where the folded portion 14D is composed of two U-shape portions.

When they are assembled, the FFC 10 goes around the top of the first circuit board 23 and stretches out via the first trench hole 263B of the back cover 26B and then stretches in via the second trench hole 264B. And then, the FFC 10 goes down and stretches out via the bottom concave trench 262B. And then, the FFC 10 is conductively fixed with the second connecting portion 30 (the second connector 32). That is, the FFC 10D stretches out and in via two trench holes (the first trench hole 263B and the second trench hole 264B) such that the fixing effect and the pulling force are improved.

Figure 6:
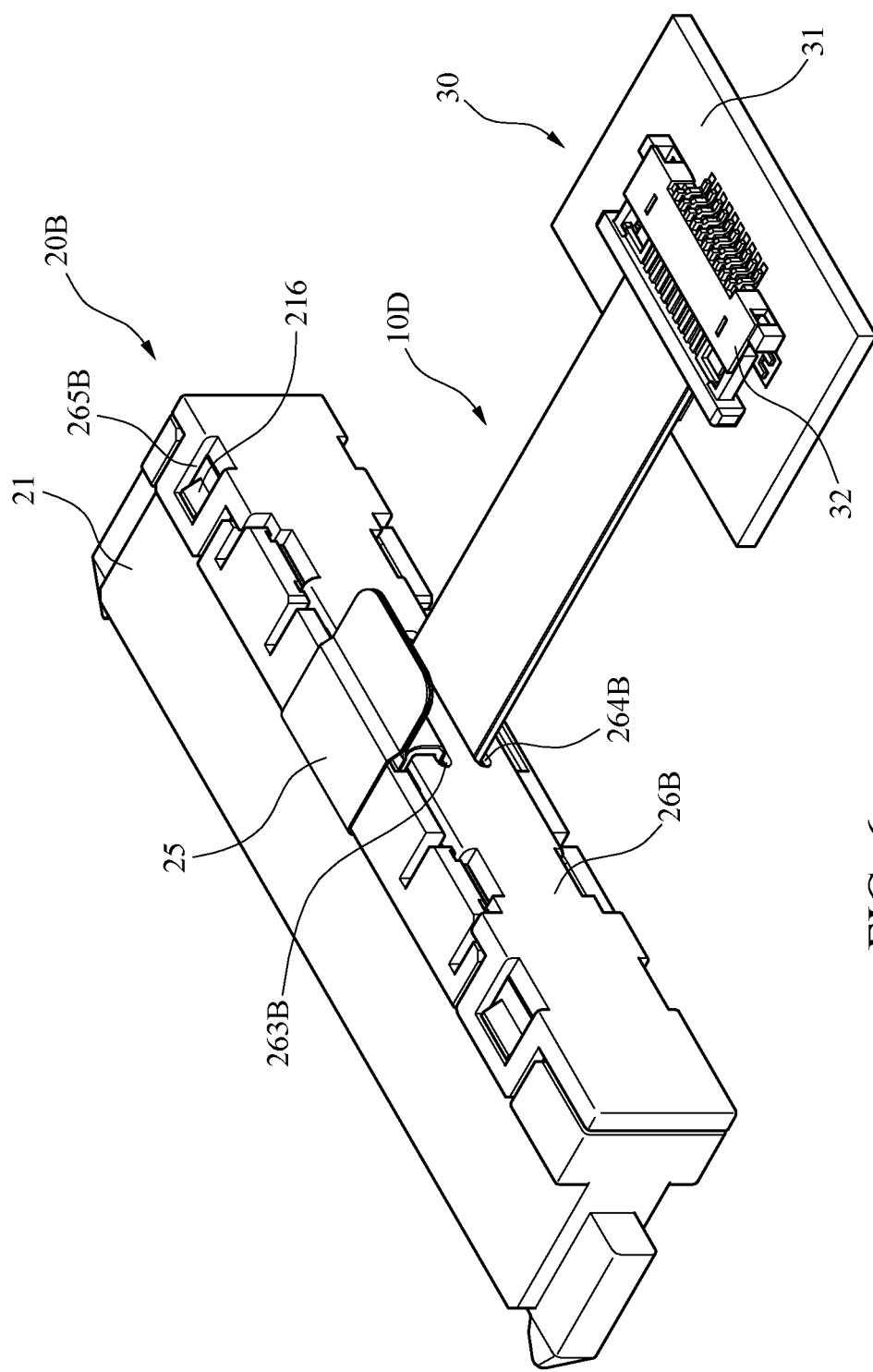
FIG. 6 is a diagram depicting an FFC connector fixing structure according to a sixth embodiment of the present invention.
Figure 6A:
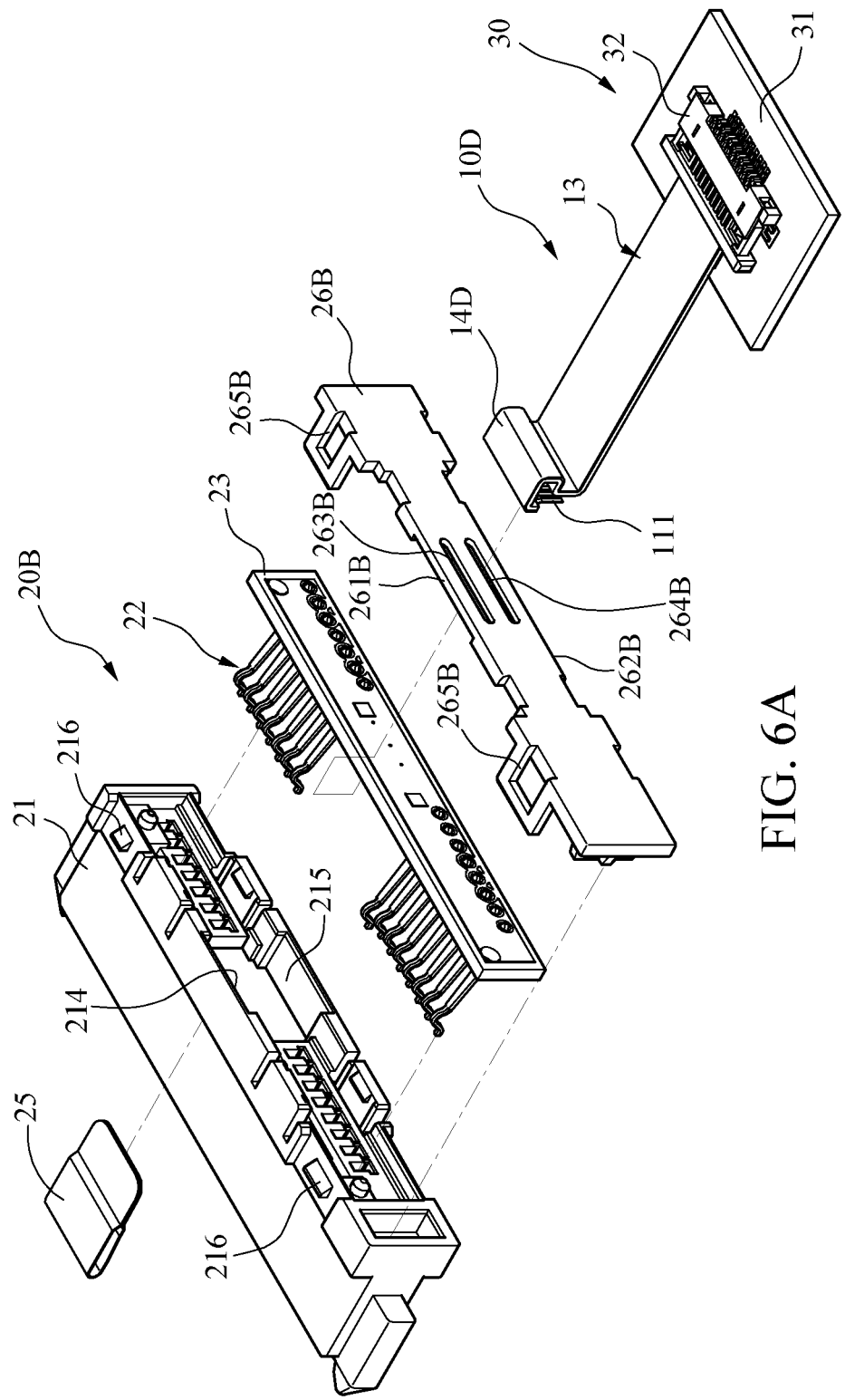
FIG. 6A is an explosion diagram depicting the FFC connector fixing structure according to a sixth embodiment of the present invention.

Please refer to FIG. 6 and FIG. 6A, which depict a FFC connector fixing structure according to a sixth embodiment of the present invention. The sixth embodiment is a little different from the fifth embodiment, and similar components have the same numbers such that further illustration can be omitted for simplicity. The difference between the fifth and the sixth embodiments is: When they are assembled, the FFC 10D goes around the top of the first circuit board 23 and stretches out via the top concave trench 261B of the back cover 26B and then stretches in via the first trench hole 263B. And then, the FFC 10D stretches out via the second trench hole 264B and then fixed with the second connecting portion 30 (the second connector 32). That is, the FFC 10D stretches out and in via two trench holes (the first trench hole 263B and the second trench hole 264B) such that the fixing effect and the pulling force are improved.

Figure 7:
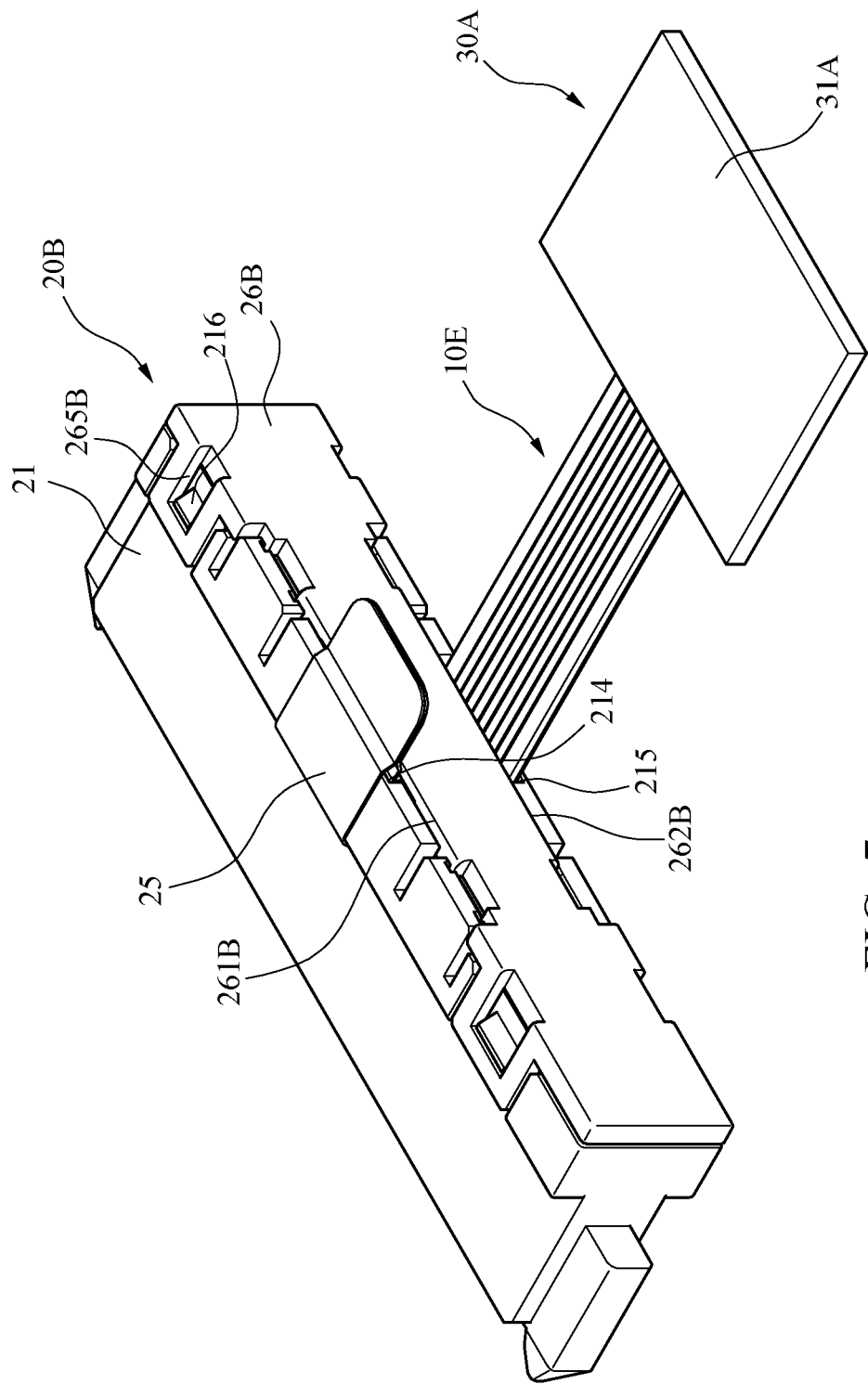
FIG. 7 is a diagram depicting an FFC connector fixing structure according to a seventh embodiment of the present invention.
Figure 7A:
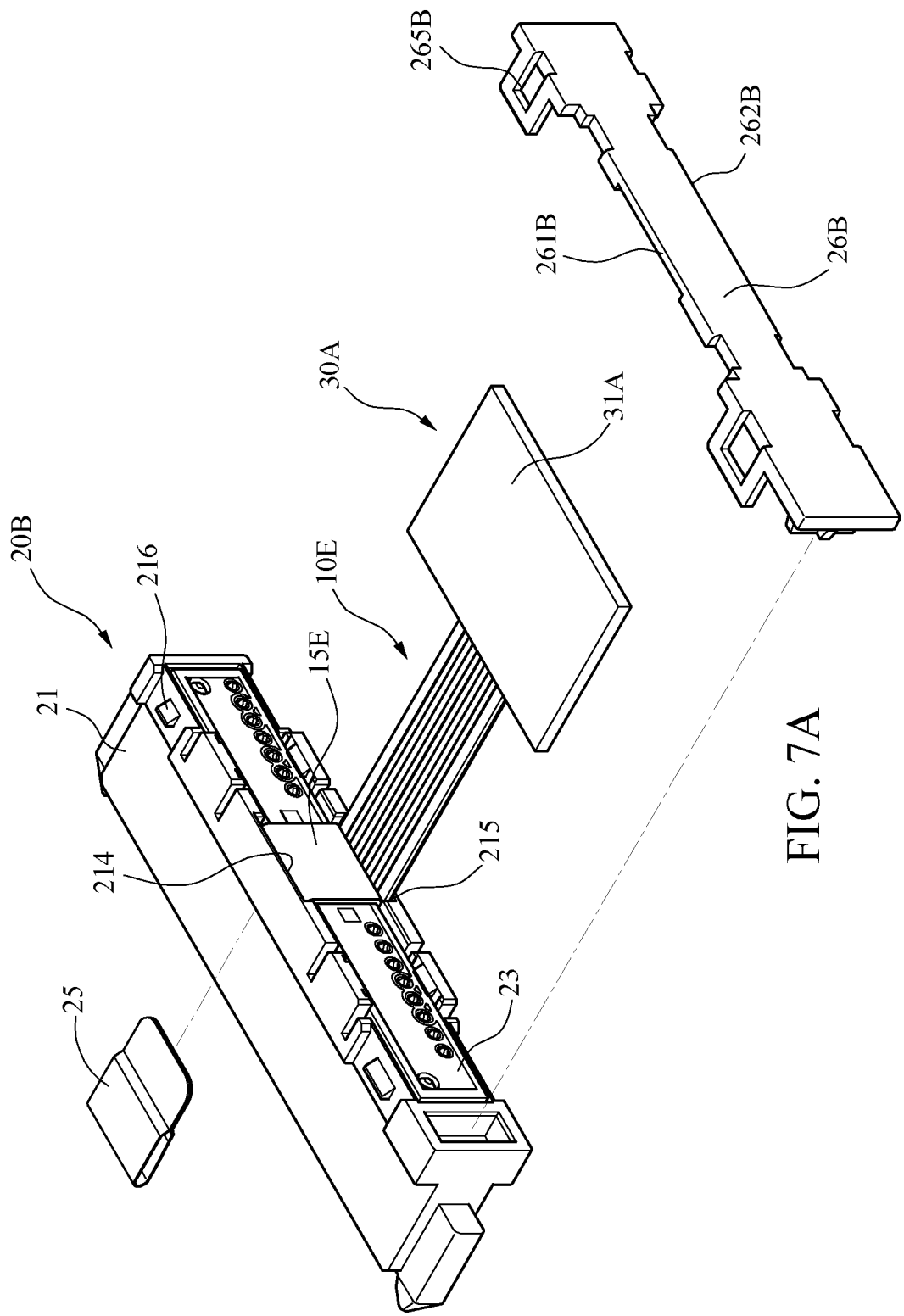
FIG. 7A is a diagram depicting a part of the FFC connector fixing structure according to a seventh embodiment of the present invention.
Figure 7B:
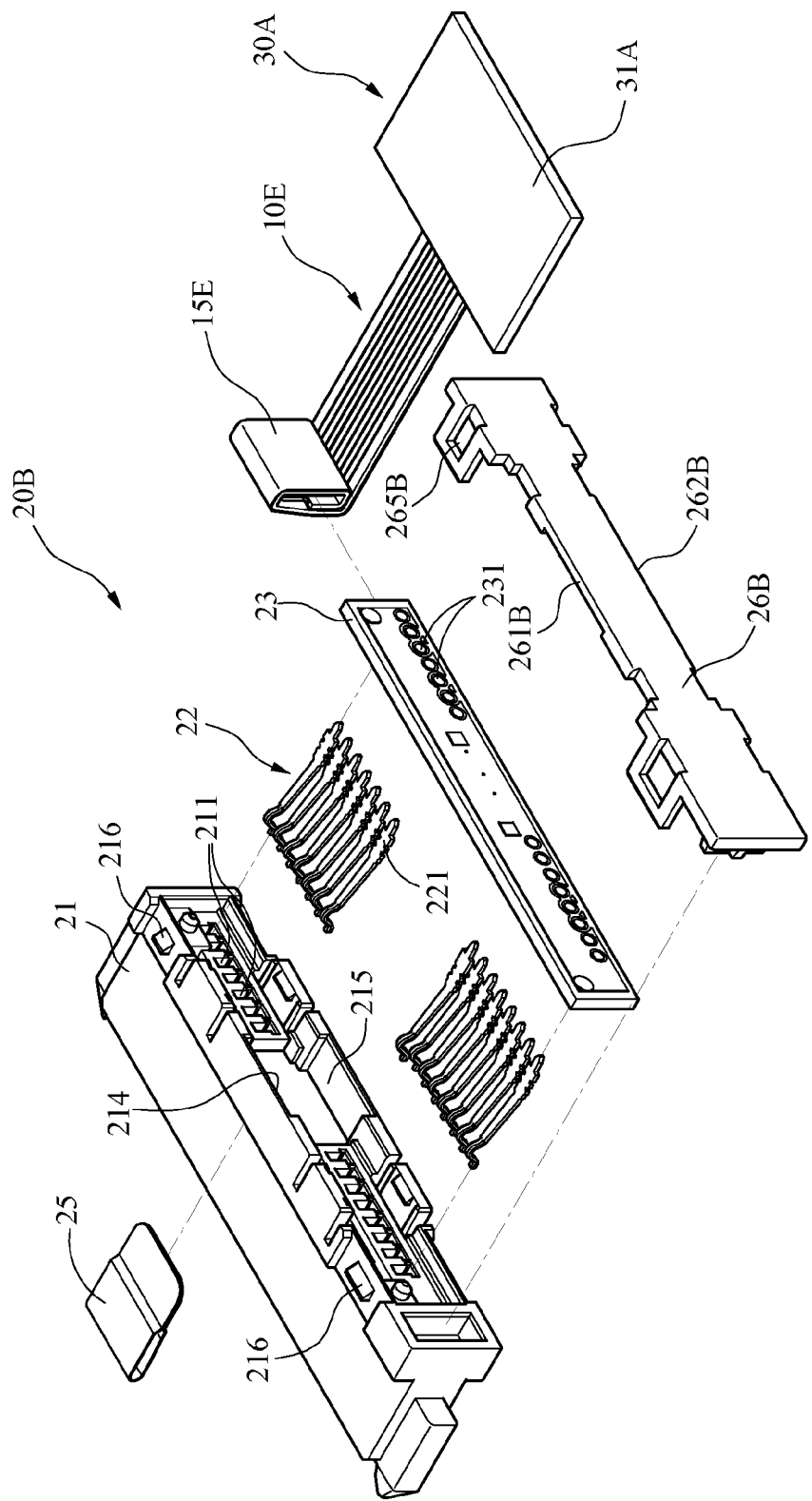
FIG. 7B is an explosion diagram depicting the FFC connector fixing structure according to a seventh embodiment of the present invention.

Please refer to FIG. 7, FIG. 7A, and FIG. 7B, which depict a FFC connector fixing structure according to a seventh embodiment of the present invention. The seventh embodiment is a little different from the fourth embodiment, and similar components have the same numbers such that further illustration can be omitted for simplicity. The difference between the seventh and the fourth embodiments is: The back cover 26V does not have the first trench hole 263B or the second trench hole 264B. Instead, a wrapping portion 15E is formed on the front end of the FFC 10E.

When they are assembled, the FFC 10E surrounds the first circuit board 23 from the bottom of the first circuit board 23 (that is, the wrapping portion 15E surrounds the first circuit board 23) and then stretches out via the bottom-plate seam 215 (the bottom plate 213) of the first slot 21 and the bottom concave trench 262 of the back cover 26B. And then, the FFC 10E is conductively fixed with the second connecting portion 30A (the second circuit board 31A). This configuration also improves the fixing effect and the pulling force.

Figure 8:
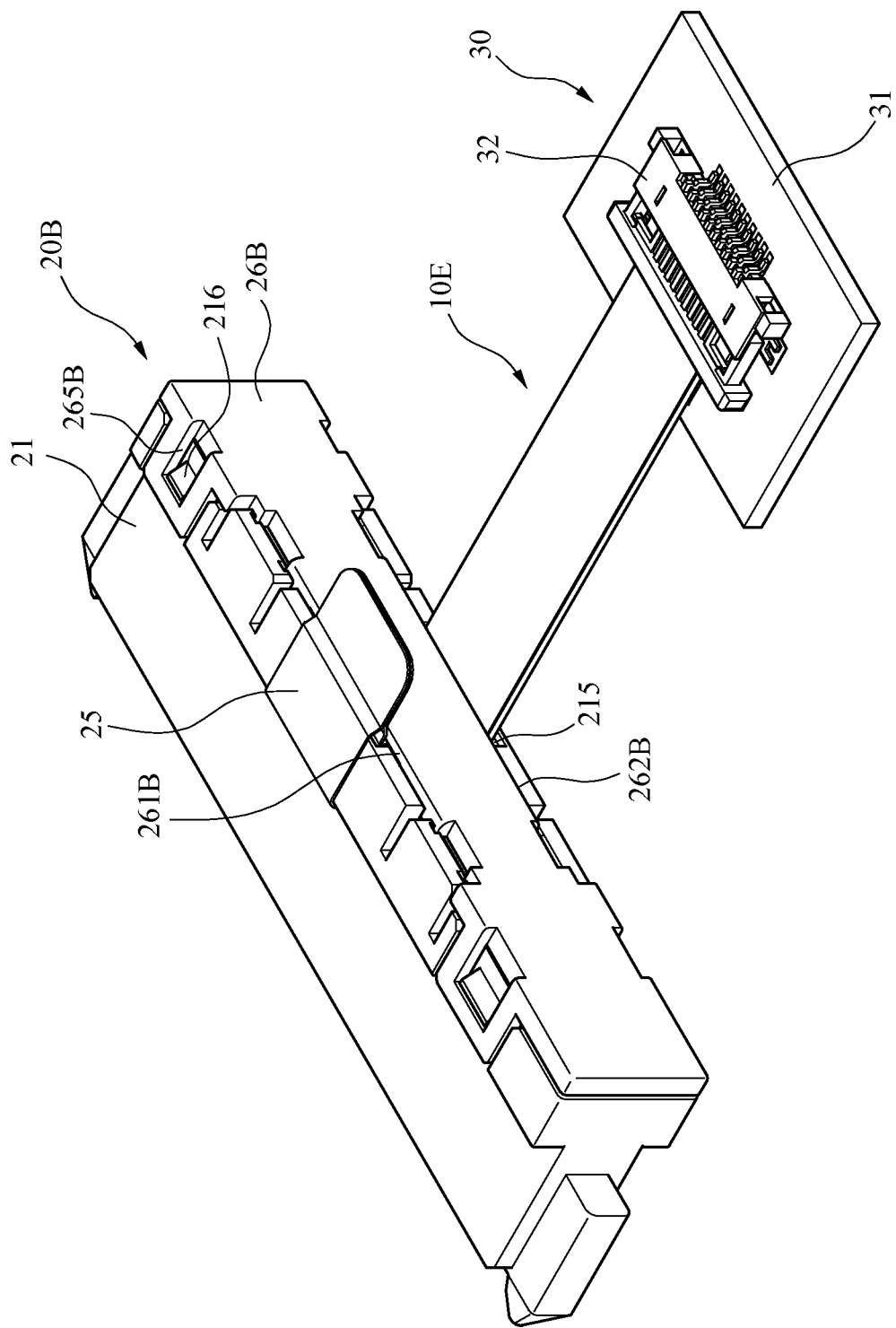
FIG. 8 is a diagram depicting an FFC connector fixing structure according to an eighth embodiment of the present invention.
Figure 8A:
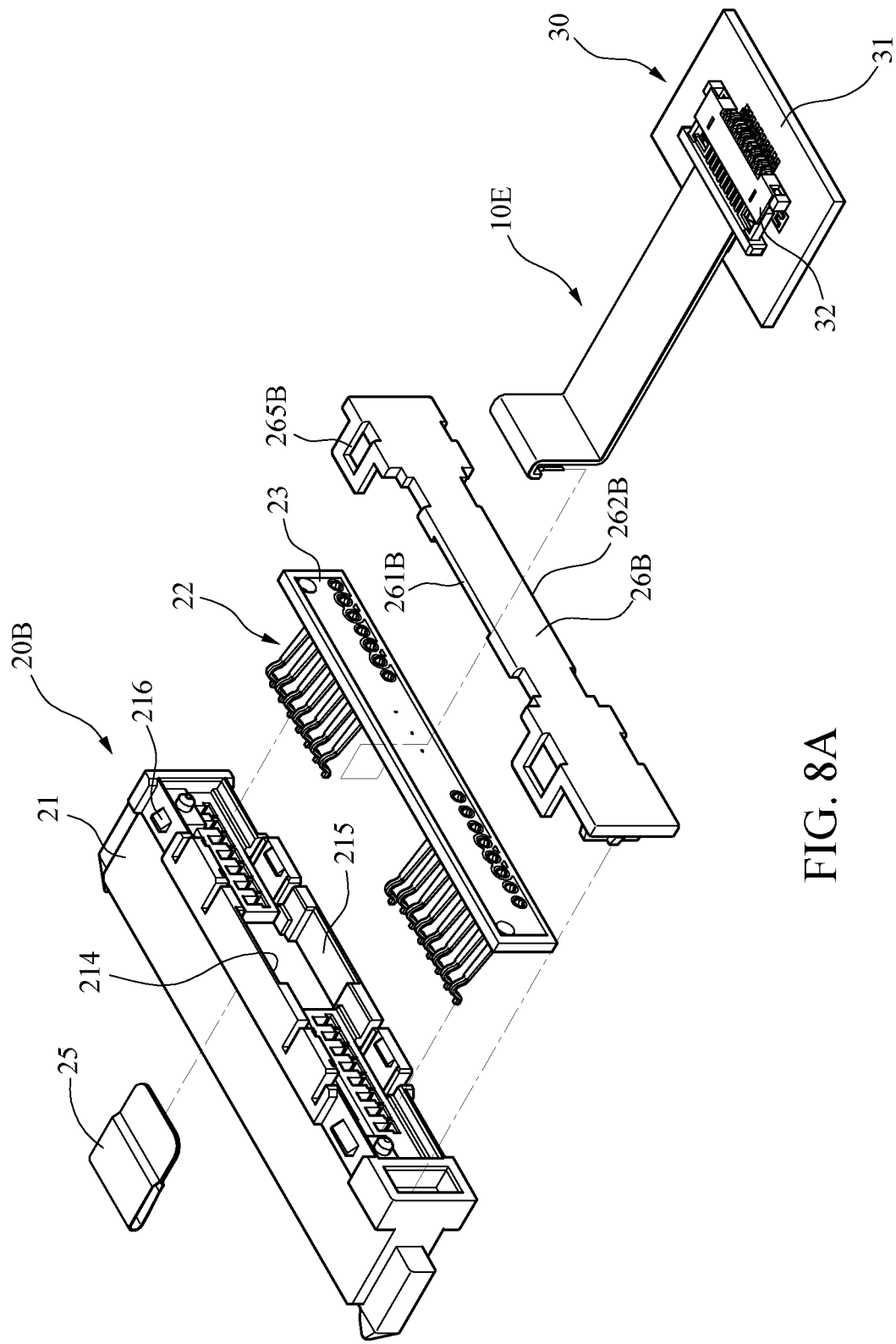
FIG. 8A is an explosion diagram depicting the FFC connector fixing structure according to an eighth embodiment of the present invention.
Figure 9:
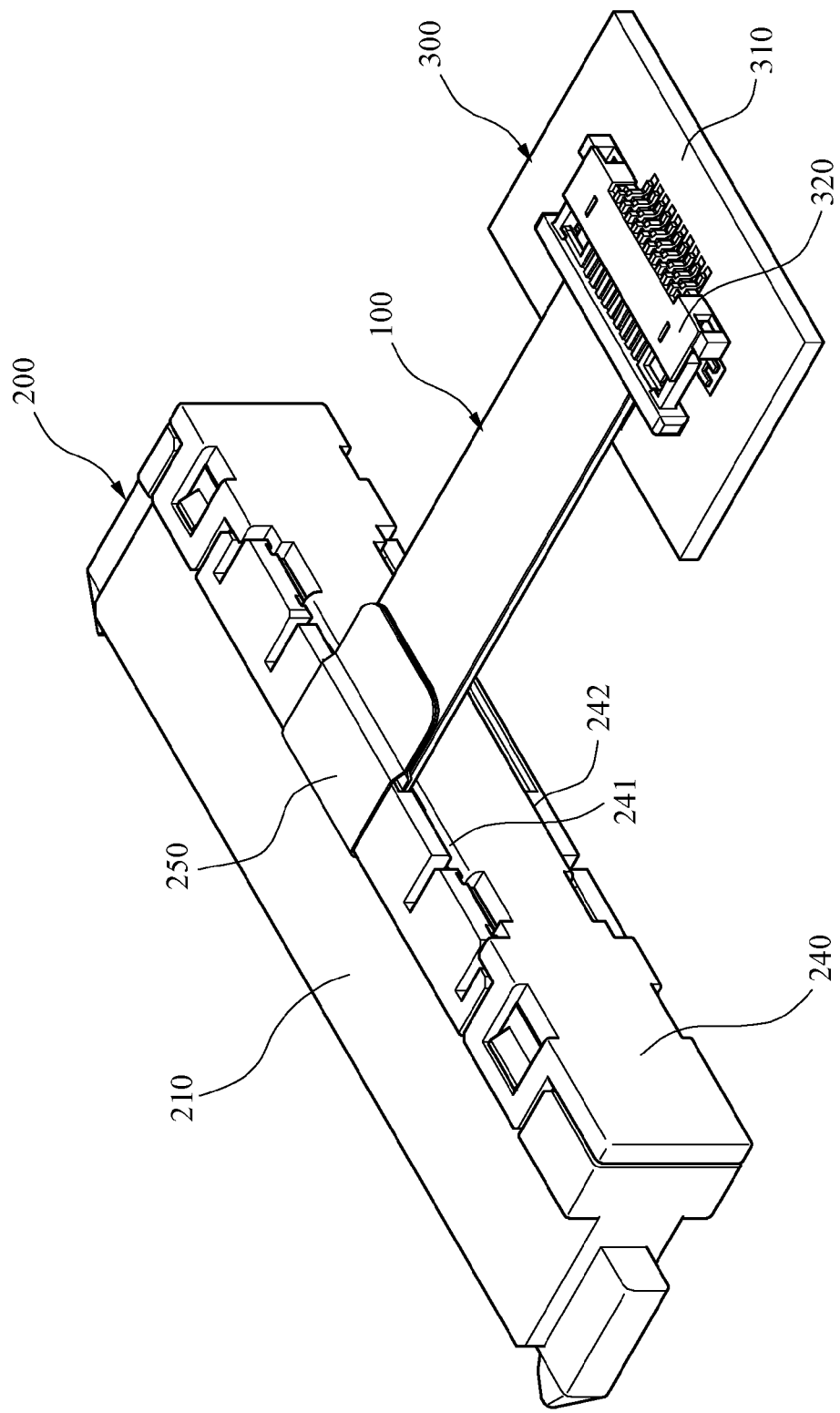
FIG. 9 is a diagram depicting an FFC connector fixing structure according to the related art.
Figure 9A:
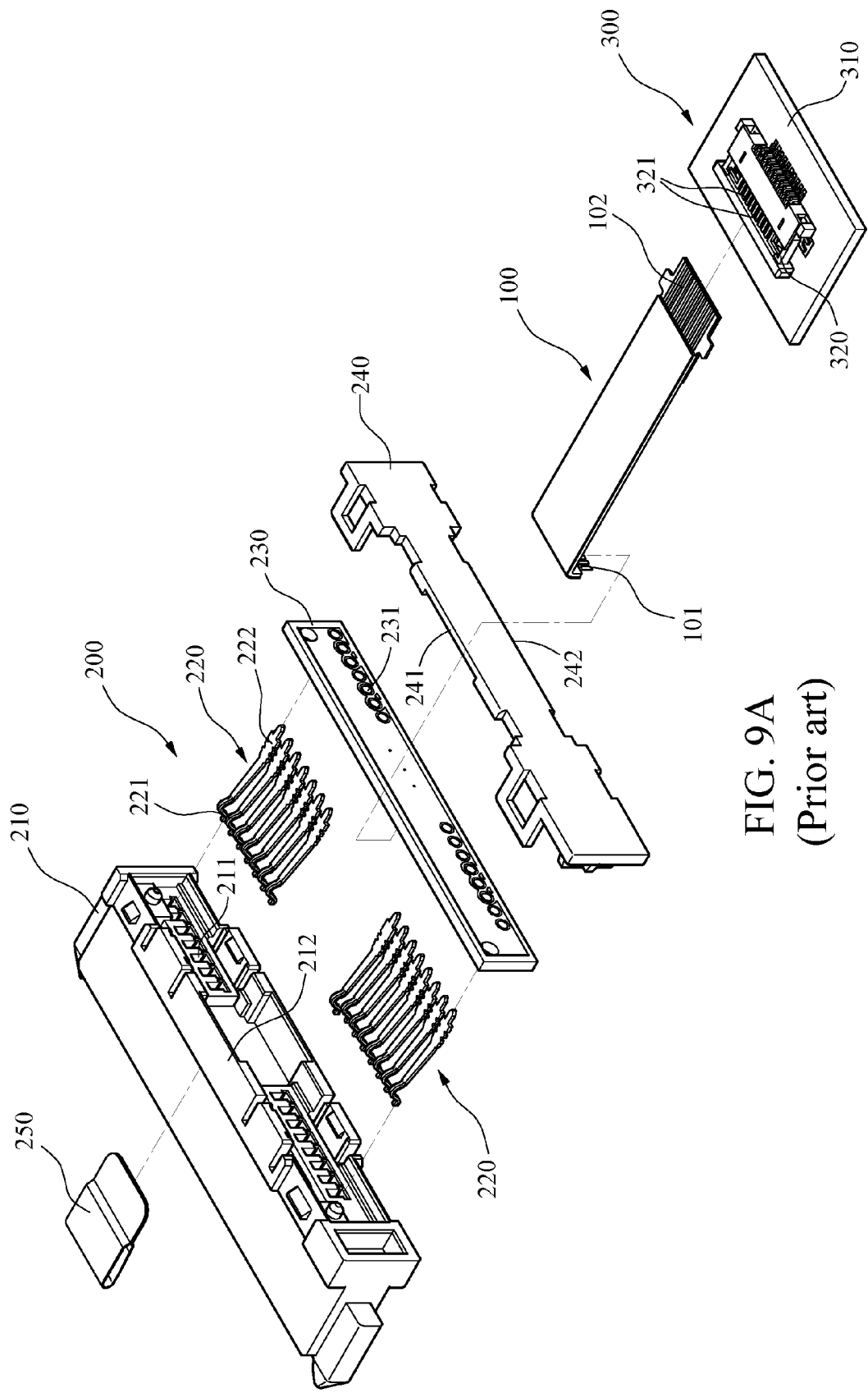
FIG. 9A is an explosion diagram depicting the FFC connector fixing structure according to the related art.

Please refer to FIG. 8 and FIG. 8A, which depict a FFC connector fixing structure according to an eighth embodiment of the present invention. The eighth embodiment is a little different from the fourth embodiment, and similar components have the same numbers such that further illustration can be omitted for simplicity. The difference between the seventh and the eighth embodiments is: When they are assembled, the FFC 10E goes from the top of the first circuit board 23 and then goes down between the first circuit board 23 and the back cover 26B. And then, the FFC 10E stretches out via the bottom-plate seam 215 (the bottom plate 213) of the first slot 21 and the bottom concave trench 262 of the back cover 26B. And then, the FFC 10E is conductively fixed with the second connecting portion 30A (the second circuit board 31A). This configuration also improves the fixing effect and the pulling force.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A flexible flat cable connector fixing structure, comprising:
   a flexible flat cable;
   a first connector, connected to an end of the flexible flat cable, the first connector comprising:
      a plurality of contacts;
      a first slot, comprising:
         a plurality of passageways, for placing the contacts; and
         a back-end seam; and
      a first circuit board, fixed with a back of the first slot, the first circuit board comprising:
         a plurality of conducting portions, for being conductively fixed with the contacts; and
         a plurality of conducting parts, positioned on a front of the first circuit board, for being electrically connected to the flexible flat cable; and
      a hold-down strip, fixed on the first circuit board;
   wherein the flexible flat cable is conductively fixed with the conducting parts, stretches through the seam, and further stretches through the hold-down strip to be positioned by the hold-down strip.

2. The flexible flat cable connector fixing structure of claim 1, wherein the flexible flat cable comprises an aluminum foil layer.

3. The flexible flat cable connector fixing structure of claim 1, wherein the first slot comprises a top plate positioned on a top and a bottom plate positioned on a bottom, and the back-end seam is formed below the top plate or above the bottom plate.

4. The flexible flat cable connector fixing structure of claim 1, wherein an opposite end of the flexible flat cable is connected to a second connector or a second circuit board.

5. A flexible flat cable connector fixing structure, comprising:
   a flexible flat cable;
   a first connector, connected to an end of the flexible flat cable, the first connector comprising:
      a plurality of contacts;
      a first slot, comprising:
         a plurality of passageways, for placing the contacts; and
      a first circuit board, fixed with a back of the first slot, the first circuit board comprising:
         a plurality of conducting portions, for being conductively fixed with the contacts;
         a plurality of conducting parts, positioned on a front of the first circuit board, for being electrically connected to the flexible flat cable; and
   a back cover, fixed on the first slot, the back cover comprising at least one trench hole fitting for the flexible flat cable, for allowing the flexible flat cable to stretch through such that the flexible flat cable is held down and supported by the back cover to raise a pulling force between the flexible flat cable and the first connector,
   wherein the back cover comprises a top concave trench and a bottom concave trench in a center of the back cover, and the trench hole is positioned between the top concave trench and the bottom concave trench.

6. The flexible flat cable connector fixing structure of claim 5, wherein the first slot comprises a back-end seam, a top plate positioned on a top, and a bottom plate positioned on a bottom, and the back-end seam is formed below the top plate or above the bottom plate.

7. The flexible flat cable connector fixing structure of claim 5, wherein an opposite end of the flexible flat cable is electrically connected to a second connector or a second circuit board.

8. The flexible flat cable connector fixing structure of claim 5, wherein a folded portion is positioned on a front end of the flexible flat cable, and the folded portion is composed of two U-shape portions.

9. A flexible flat cable connector fixing structure, comprising:
   a flexible flat cable;
   a first connector, connected to an end of the flexible flat cable, the first connector comprising:
      a plurality of contacts;
      a first slot, comprising:
         a plurality of passageways, for placing the contacts; and
      a first circuit board, fixed with a back of the first slot, the first circuit board comprising:
         a plurality of conducting portions, for being conductively fixed with the contacts;
         a plurality of conducting parts, positioned on a front of the first circuit board, for being electrically connected to the flexible flat cable; and
   a back cover, fixed on the first slot, for holding down and supporting flexible flat cable to raise a pulling force between the flexible flat cable and the first connector,
   wherein a wrapping portion is positioned on a front end of the flexible flat cable, and the wrapping portion surrounds the first circuit board.

10. The flexible flat cable connector fixing structure of claim 9, wherein the first slot comprises a back-end seam, a top plate positioned on a top, and a bottom plate positioned on a bottom, and the back-end seam is formed below the top plate or above the bottom plate.

11. The flexible flat cable connector fixing structure of claim 9, wherein the back cover comprises a top concave trench and a bottom concave trench in a center of the back cover.

12. The flexible flat cable connector fixing structure of claim 9, wherein an opposite end of the flexible flat cable is electrically connected to a second connector or a second circuit board.

* * * * *